US007044572B2

(12) United States Patent
Hirayama

(10) Patent No.: US 7,044,572 B2
(45) Date of Patent: May 16, 2006

(54) PRINTHEAD AND IMAGE PRINTING APPARATUS

(75) Inventor: Nobuyuki Hirayama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/079,226

(22) Filed: Mar. 15, 2005

(65) Prior Publication Data

US 2005/0157088 A1 Jul. 21, 2005

Related U.S. Application Data

(62) Division of application No. 10/622,544, filed on Jul. 21, 2003, now Pat. No. 6,890,048.

(30) Foreign Application Priority Data

Jul. 23, 2002 (JP) ............................ 2002-214007

(51) Int. Cl.
*B41J 2/05* (2006.01)
*B41J 29/38* (2006.01)
*H01L 27/10* (2006.01)

(52) U.S. Cl. .......................... 347/12; 347/59; 257/204

(58) Field of Classification Search .................. 347/12, 347/57–59, 145, 180–182; 257/202, 204, 257/206; 400/120.05, 120.06
See application file for complete search history.

(56) References Cited

U.S. PATENT DOCUMENTS

| | | | | |
|---|---|---|---|---|
| 4,313,124 | A | 1/1982 | Hara | 347/57 |
| 4,330,787 | A | 5/1982 | Sato et al. | 347/63 |
| 4,345,262 | A | 8/1982 | Shirato et al. | 347/10 |
| 4,459,600 | A | 7/1984 | Sato et al. | 347/47 |
| 4,463,359 | A | 7/1984 | Ayata et al. | 347/56 |
| 4,558,333 | A | 12/1985 | Sugitani et al. | 347/65 |
| 4,723,129 | A | 2/1988 | Endo et al. | 347/56 |
| 4,740,796 | A | 4/1988 | Endo et al. | 347/56 |
| 4,947,192 | A | 8/1990 | Hawkins et al. | 347/59 |
| 6,780,701 | B1 | 8/2004 | Kanda et al. | 438/218 |
| 2002/0191044 | A1 | 12/2002 | Saito et al. | 347/37 |
| 2002/0191052 | A1 | 12/2002 | Hirayama et al. | 347/57 |

FOREIGN PATENT DOCUMENTS

WO 01/03932 1/2001

*Primary Examiner*—Manish Shah
*Assistant Examiner*—Geoffrey Mruk
(74) *Attorney, Agent, or Firm*—Fitzpatrick, Cella, Harper & Scinto

(57) ABSTRACT

This invention provides a printhead capable of decreasing the ON resistance value without increasing the heater board size in order to downsize the heater board, an image printing apparatus using the printhead, and a control method therefor. In the printhead, heater resistors are series-connected to normal MOS transistors in each group on a heat board. The pitch of the heater resistors and the pitch of the normal MOS transistors are designed equal to each other in order to shorten the connection line. One high-breakdown-voltage MOS transistor is arranged in each group, and the pitch is designed to a length corresponding to the product of the pitch of the heater resistors and the number x of heater resistors. The high-breakdown-voltage MOS transistor has a higher ON resistance value per unit area than that of the normal MOS transistor. However, the area of the high-breakdown-voltage MOS transistor is larger by x times than that of the normal MOS transistor. This can suppress the ON resistance of the high-breakdown-voltage MOS transistor satisfactorily low.

14 Claims, 16 Drawing Sheets

PRINTHEAD AND IMAGE PRINTING APPARATUS

This application is a division of application Ser. No. 10/622,544, filed Jul. 21, 2003, the entire disclosure of which is incorporated herein by reference.

FIELD OF THE INVENTION

The present invention relates to a printhead and image printing apparatus and, more particularly, to a heater driving circuit in an ink-jet printhead.

BACKGROUND OF THE INVENTION

One of information output apparatuses in a word processor, personal computer, facsimile apparatus, and the like is an image printing apparatus which prints desired information such as a character or image on a sheet-like printing medium such as a paper sheet or film.

Various methods are known as the printing method of the image printing apparatus. In recent years, an ink-jet method has particularly received a great deal of attention because the ink-jet method enables noncontact printing on a printing medium such as a paper sheet, easily achieves color printing, and generates little noise. In terms of low cost and easy downsizing, the printer generally widely adopts a serial printing arrangement in which a printhead for discharging ink in accordance with desired printing information is mounted, and printing is done while the printhead is reciprocally scanned in a direction perpendicular to the feed direction of a printing medium such as a paper sheet.

FIG. 12 shows a conventional heater board 1100 of a printhead which prints by bubbling and discharging ink by using heat energy.

The conventional heater board (printing element board) 1100 comprises, on a single semiconductor substrate, heater resistors 1101 serving as electrothermal transducers, high-breakdown-voltage MOS transistors 1102 which switch a current, and bit selection circuits 1103 which select desired printing pixels (bits).

FIG. 13 shows an example of the layout of the heater resistors 1101 and high-breakdown-voltage MOS transistors 1102 on the conventional heater board 1100 of the printhead.

Heater resistors 1101*a*1 to 1101*ax*, 1101*b*1 to 1101*bx*, . . . , 1101*m*1 to 1101*mx* are connected to corresponding high-breakdown-voltage MOS transistors 1102*a*1 to 1102*ax*, 1102*b*1 to 1102*bx*, . . . , 1102*m*1 to 1102*mx*.

In order to shorten the connection line between each heater resistor and a corresponding high-breakdown-voltage MOS transistor and effectively utilize the board area, the heater pitch as the heater resistor interval and the pitch of the high-breakdown-voltage MOS transistor which drives the heater are designed equal to each other.

Driving of the heater resistor has conventionally used a bipolar transistor. To cope with high density of heater resistors and low cost, the above-mentioned high-breakdown-voltage MOS transistor is being used.

For high-speed printing, it is desirable to simultaneously drive nozzles (heater resistors) as many as possible. However, a simultaneously supplied current is restricted because of the limitation on the current supply ability of the power supply and a voltage drop by the resistance of wiring from the power supply to a heater resistor.

For this reason, a plurality of heater resistors are driven by time division to discharge ink. For example, heater resistors are classified into a plurality of groups, and driven by time division so as not to simultaneously drive two or more heater resistors with in a group. This suppresses the total heater current, eliminating the need for supplying a large current at once.

FIG. 14 shows a heater resistor driving circuit for discharging ink from each nozzle.

Reference numeral 1101 denotes each heater resistor; 1102, each high-breakdown-voltage MOS transistor; 1104, a power supply line which is connected to the power supply; and 1105, each control terminal which is connected to a controller.

As shown in FIG. 14, the heater resistors 1101 and corresponding high-breakdown-voltage MOS transistors 1102 are classified into groups a to m in equal numbers.

More specifically, in group a, the power supply line 1104 is commonly connected to the heater resistors 1101*a*1 to 1101*ax*. The high-breakdown-voltage MOS transistors 1102*a*1 to 1102*ax* are series-connected to the corresponding heater resistors 1101*a*1 to 1101*ax* between the power supply 1104 and ground.

When the bit selection circuit 1103 outputs control signals 1106*a*1 to 1106*ax* to the heater resistors 1101 via the control terminals 1105, the switching circuits of the high-breakdown-voltage MOS transistors 1102*a*1 to 1102*ax* are turned on to supply a current from the power supply via the power supply line 1104 and heat the heater resistors 1101*a*1 to 1101*ax*.

The arrangements of groups b to m are also the same as that of group a.

The control signals 1106*a*1 to 1106*ax* from the bit selection circuit 1103 are input to the control terminals 1105 to control driving of the corresponding high-breakdown-voltage MOS transistors 1102*a*1 to 1102*ax*. Since the heater resistors 1101*a*1 to 1101*ax* receive a voltage of 5 V or more, e.g., 16 to 24 V, the high-breakdown-voltage MOS transistors 1102*a*1 to 1102*ax* have a higher breakdown voltage than that of a general MOS transistor.

FIG. 15 is a timing chart showing the heater driving circuit in FIG. 14, i.e., a heater driving circuit for driving heater resistors belonging to each group.

Group a in FIG. 14 will be exemplified. The control signals 1106*a*1 to 1106*ax* are timing signals for driving the first to xth heater resistors 1101*a*1 to 1101*ax* belonging to group a. That is, the control signal 1106 represents a waveform input to the control terminal 1105 of each high-breakdown-voltage MOS transistor 1102 in group a. The high-breakdown-voltage MOS transistor 1102 is turned on (connected) for Hi and off (disconnected) for Lo. The remaining groups b to m operate similarly to group a.

In this manner, heaters in each group are sequentially driven by time division. The current in each group can always be controlled to a current of 1 bit (pixel printed by one nozzle) or less, and no large current need be supplied to heater resistors at once. FIGS. 16A and 16B show the sectional structures of a high-breakdown-voltage MOS transistor and normal-breakdown-voltage MOS transistor.

FIG. 16B shows a normal-breakdown-voltage NMOS transistor formed on a P-type semiconductor substrate. $N^+$ diffusion layers 111 and 113 respectively form a source and drain, and a gate 112 is arranged between them.

FIG. 16A shows a high-breakdown-voltage NMOS transistor formed on a P-type semiconductor substrate. $N^+$ diffusion layers 111 and 113 of the high-breakdown-voltage MOS transistor respectively form a source and drain, and a gate 112 is arranged between them, similar to the normal-breakdown-voltage NMOS transistor.

In the high-breakdown-voltage MOS transistor, the gate length is larger than that in the normal MOS transistor, and an $N^-$ diffusion layer 114 for maintaining a uniform field is arranged between the gate 112 and the drain 113, which yields a high breakdown voltage.

In recent years, higher-speed, higher-resolution printers are required, and the printhead of the printer is equipped with many nozzles at a high density. As for the arrangement of a heater board used for the printhead, it is necessary to increase the number of heaters (heater resistors) and decrease the pitch of heaters (heater resistors).

The heater board is constituted by forming a heater and driving circuit on a single semiconductor substrate. The number of heater boards formed from one wafer must be increased to reduce the cost. For this purpose, the heater board must be downsized.

However, an increase in heater density and downsizing of the heater board pose the following problems.

When the heater density is increased, the pitch of heater driving transistors is determined, and the unit area of the heater driving transistor decreases. As a result, the ON resistance of the transistor in driving the heater increases.

Also when the area of the driving circuit is decreased for downsizing the heater board, the transistor area decreases. The ON resistance of the transistor in driving the heater increases.

The heater and the transistor serving as a heater driving switch are series-connected to the power supply, as shown in FIG. 14. If the ON resistance of the transistor in driving the heater increases upon increasing the heater density or downsizing the heater board, power consumption of the transistor increase and the ratio of power consumption of the heater to application power decreases, resulting in low power use efficiency.

If heat generation increases in the transistor, generated heat is accumulated in the transistor to change the ink discharge characteristic, or destructs the printhead.

To prevent this, it is important to decrease the ratio of the ON resistance of the transistor in driving the heater to the heater resistance when increasing the heater density or downsizing the heater board.

As a method of decreasing the ratio of the ON resistance of the transistor in driving the heater to the heater resistance, the heater resistance value is increased to relatively decrease the ratio of the ON resistance.

In the use of the method of relatively decreasing the ratio of the ON resistance, if heating amount of heater is not changed, the voltage applied to the heater must be increased. Along with this, the power supply voltage rises.

That is, if the power supply voltage rises, the voltage applied to the high-breakdown-voltage MOS transistor for driving a heater also rises. The breakdown voltage of the high-breakdown-voltage MOS transistor must be further increased.

To increase the breakdown voltage of the high-breakdown-voltage MOS transistor, the gate length or the length of the drift region must be increased. In either measure, since the transistor area increases, it may be hard to downsize the heater board.

As described above, it is important to decrease the ON resistance of the transistor in driving the heater without increasing the transistor area when increasing the heater density or downsizing the heater board.

SUMMARY OF THE INVENTION

The present invention has been made to overcome the conventional drawbacks, and has as its object to provide a printhead capable of decreasing the ON resistance value without increasing the heater board size in order to downsize the heater board, an image printing apparatus using the printhead, and a control method therefor.

To achieve the above object, an image printing apparatus according one aspect of the present invention has the following arrangement. That is, an image printing apparatus which prints an image in accordance with input printing data by a printhead having a plurality of printing elements comprises a plurality of individual switches which are arranged for the respective printing elements, a common switch which is arranged commonly to printing elements belonging to each of a plurality of groups of the printing elements, and driving means for controlling the plurality of individual switches and the common switch and driving the printing elements in accordance with the input printing data, wherein the individual switch is formed from a MOS transistor, and the common switch is formed from a high-breakdown-voltage MOS transistor having a higher breakdown voltage than a breakdown voltage of the MOS transistor for the individual switch.

For example, the printing elements, the plurality of individual switches, and the common switch may be arranged on a single semiconductor substrate.

For example, the MOS transistor for the individual switch and the high-breakdown-voltage MOS transistor may be series-connected.

For example, the MOS transistor for the individual switch and the high-breakdown-voltage MOS transistor may be formed from NMOS transistors.

For example, the printing element, the MOS transistor for the individual switch, and the high-breakdown-voltage MOS transistor for the common switch may be sequentially arranged into a circuit from a power supply line side to ground.

For example, the MOS transistor for the individual switch may include a PMOS transistor, the high-breakdown-voltage MOS transistor include an NMOS transistors, and the MOS transistor for the individual switch, the printing element, and the high-breakdown-voltage MOS transistor for the common switch be sequentially arranged into a circuit from a power supply line side to ground.

For example, the printhead may include a printhead which discharges ink by using heat energy, and the image printing apparatus further comprise a thermal transducer for generating heat energy to be applied to ink.

To achieve the above object, a printhead according another aspect of the present invention has the following arrangement. That is, a printhead which has a plurality of printing elements and is used in an image printing apparatus for printing an image in accordance with input printing data comprises a plurality of individual switches which are arranged for the respective printing elements, a common switch which is arranged commonly to printing elements belonging to each of a plurality of groups of the printing elements, and signal reception means for, when receiving an individual switch operating signal for operating the plurality of individual switches or a common switch operating signal for operating the common switch, inputting the received signal to the individual switch or the common switch, wherein the individual switch is formed from a MOS transistor, and the common switch is formed from a high-breakdown-voltage MOS transistor having a higher breakdown voltage than a breakdown voltage of the MOS transistor for the individual switch.

For example, the printing elements, the plurality of individual switches, and the common switch may be arranged on a single semiconductor substrate.

For example, the MOS transistor for the individual switch and the high-breakdown-voltage MOS transistor may be formed from NMOS transistors.

For example, the printing element, the MOS transistor for the individual switch, and the high-breakdown-voltage MOS transistor for the common switch may be sequentially arranged into a circuit from a power supply line side to ground.

For example, the MOS transistor for the individual switch may include a PMOS transistor, the high-breakdown-voltage MOS transistor include an NMOS transistors, and the MOS transistor for the individual switch, the printing element, and the high-breakdown-voltage MOS transistor for the common switch be sequentially arranged into a circuit from a power supply line side to ground.

For example, the printhead may include a printhead which discharges ink by using heat energy, and further comprises a thermal transducer for generating heat energy to be applied to ink.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings. The following embodiments will describe an ink-jet printhead, a serial ink-jet printer serving as an image printing apparatus having the printhead, and a control method therefor. However, the scope of the present invention is not limited to the described examples.

First Embodiment

An ink-jet printer having an ink-jet printhead according to the first embodiment will be explained.

[General Description of Ink-Jet Printer]

Figure 9:
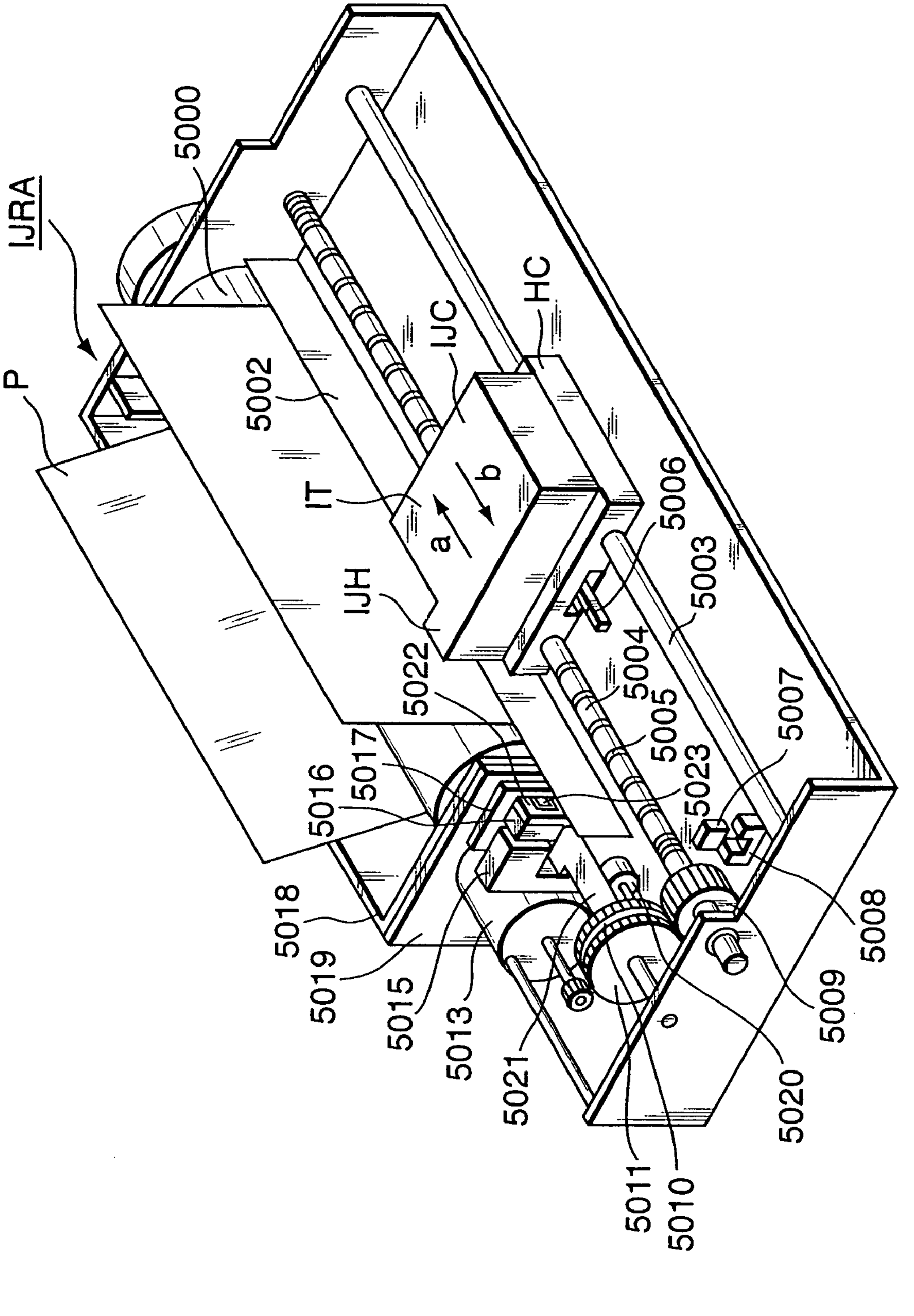
FIG. 9 is a perspective view schematically showing the outer appearance of an ink-jet printer according to the embodiment of the present invention.

FIG. 9 is a perspective view schematically showing the outer appearance of an ink-jet printer IJRA as a typical ink-jet printer according to the embodiment of the present invention.

In FIG. 9, a pin (not shown) is attached to a carriage HC which engages with a helical groove 5004 of a lead screw 5005 that rotates via driving force transfer gears 5009 to 5011 while interlocking with forward/reverse rotation of a driving motor 5013. The carriage HC is supported by a guide rail 5003 and reciprocates in directions indicated by arrows a and b.

The carriage HC supports an integral ink-jet cartridge IJC which incorporates a printhead IJH and ink tank IT.

Reference numeral 5002 denotes a sheet press plate which presses a printing sheet P against a platen 5000 in the moving direction of the carriage HC.

Reference numerals 5007 and 5008 denote photocouplers serving as home position detectors for detecting the presence of a carriage lever 5006 in a corresponding region and switching the rotational direction of the motor 5013.

Reference numeral 5016 denotes a member which supports a cap member 5022 that caps the front surface of the printhead IJH; and 5015, a suction unit which sucks the interior of the cap and performs suction recovery of the printhead via an intra-cap opening 5023.

Reference numeral 5017 denotes a cleaning blade; and 5019, a member capable of moving this blade back and forth. The cleaning blade 5017 and member 5019 are supported by a main body support plate 5018. The blade is not limited to this embodiment, and a known cleaning blade can be applied to the embodiment.

Reference numeral 5021 denotes a lever which starts suction for suction recovery, and moves together with movement of a cam 5020 engaged with the carriage. A driving force from the driving motor is controlled by a known transfer mechanism such as a clutch switch.

Capping, cleaning, and suction recovery are executed by desired processes at corresponding positions by the operation of the lead screw 5005 when the carriage comes to the home-position region. This embodiment can adopt any setting as long as desired operations are done at known timings.

[Description of Printing Control Arrangement]

A control arrangement which executes printing control of the ink-jet printer IJRA will be described.

Figure 10:
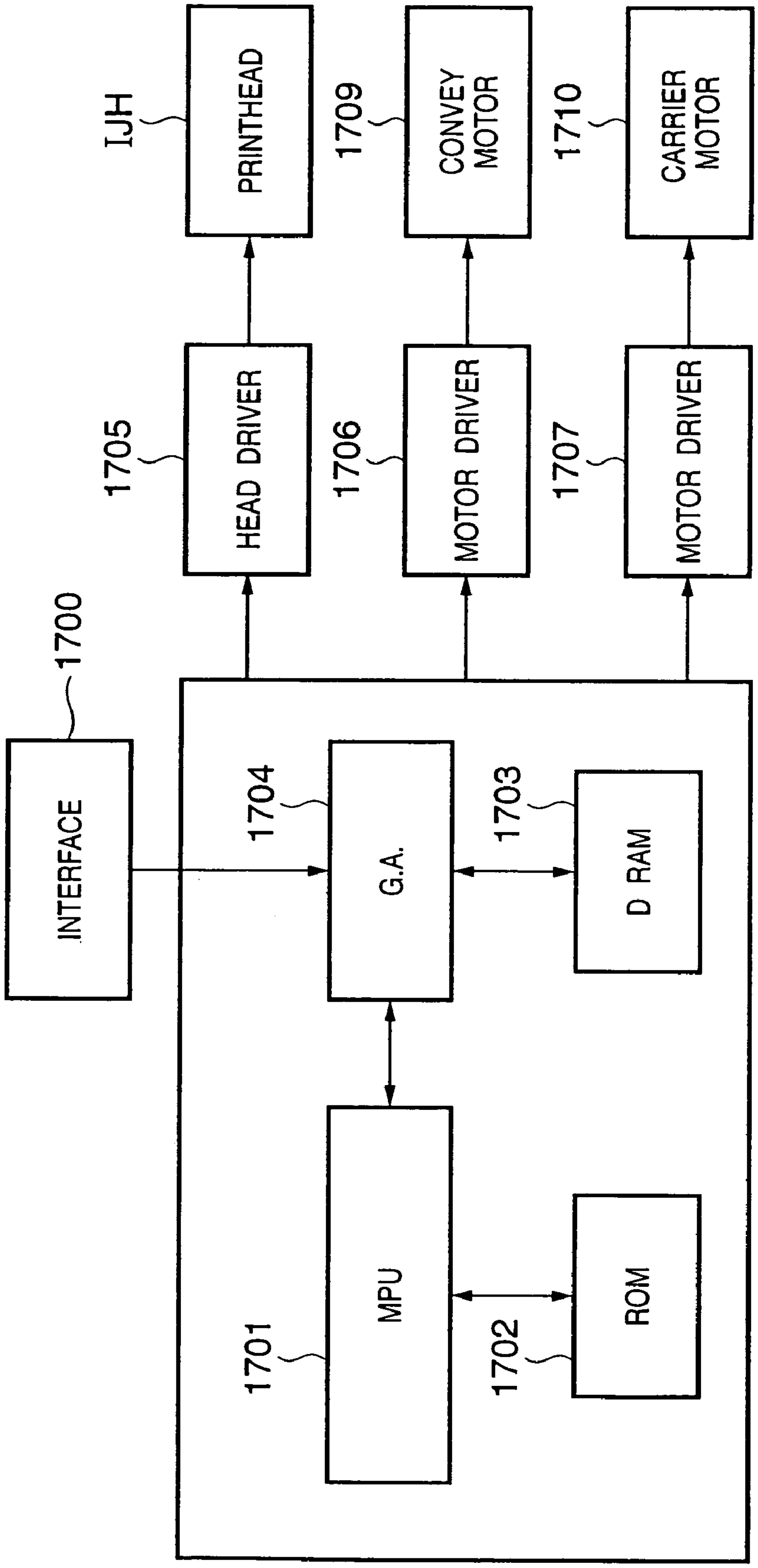
FIG. 10 is a block diagram showing the arrangement of an ink-jet printer control circuit according to the embodiment of the present invention.

FIG. 10 is a block diagram showing the arrangement of a control circuit for the ink-jet printer IJRA. In FIG. 10, reference numeral 1700 denotes an interface which inputs a printing signal; 1701, an MPU; 1702, a ROM which stores a control program executed by the MPU 1701; and 1703, a DRAM which stores various data (printing signal, printing data supplied to the head, and the like).

Reference numeral 1704 denotes a gate array (G.A.) which controls supply of printing data to the printhead IJH, and also controls data transfer between the interface 1700, the MPU 1701, and the RAM 1703.

Reference numeral 1710 denotes a carrier motor for conveying the printhead IJH; 1709, a convey motor for conveying a printing sheet; 1705, a head driver which drives the printhead; and 1706 and 1707, motor drivers for respectively driving the convey motor 1709 and carrier motor 1710.

The operation of the control arrangement will be explained. When a printing signal is input to the interface 1700, the printing signal is converted into printing data between the gate array 1704 and the MPU 1701. The motor drivers 1706 and 1707 are driven, and the printhead is driven in accordance with the printing data sent to the head driver 1705 to print the data.

In this case, the control program executed by the MPU 1701 is stored in the ROM 1702. It is also possible to add an erasable/writable storage medium such as an EEPROM and change the control program from a host computer connected to the ink-jet printer IJRA.

The ink tank IT and printhead IJH may be integrated into an exchangeable ink cartridge IJC, as described above. It is also possible to separately constitute the ink tank IT and printhead IJH, and when ink runs short, exchange only the ink tank IT.

[Ink Cartridge]

Figure 11:
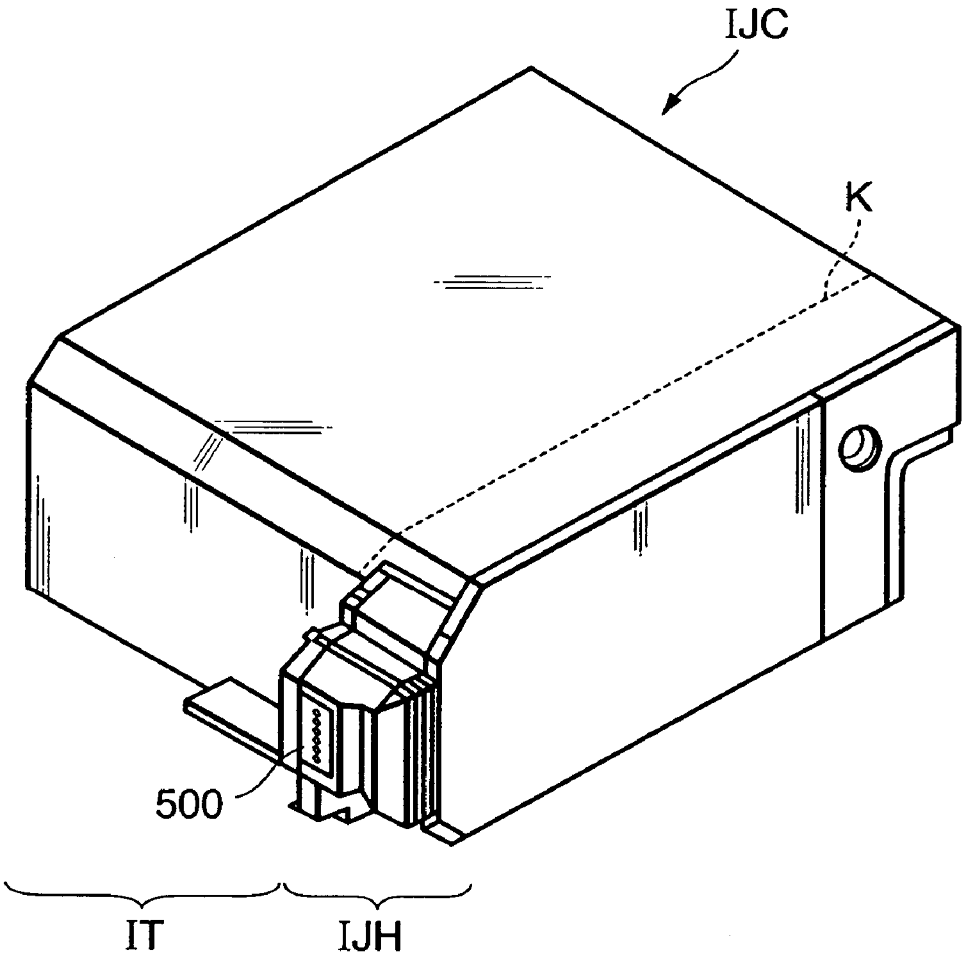
FIG. 11 is a perspective view showing the outer appearance of an ink cartridge dividable into an ink tank and head according to the embodiment of the present invention.
Figure 12:
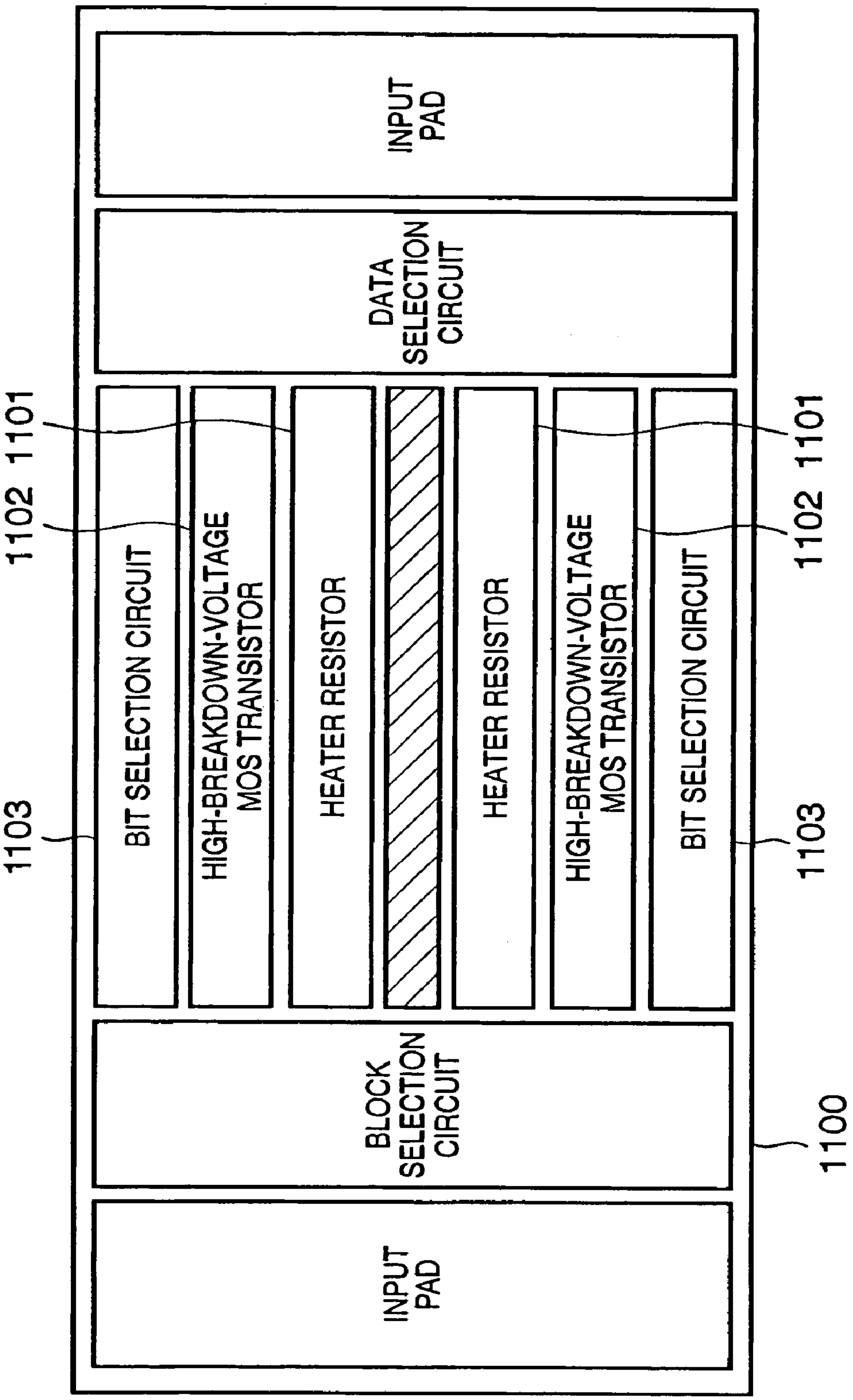
FIG. 12 PRIOR ART
FIG. 12 is a block diagram showing an example of the arrangement of a conventional heater board.
Figure 13:
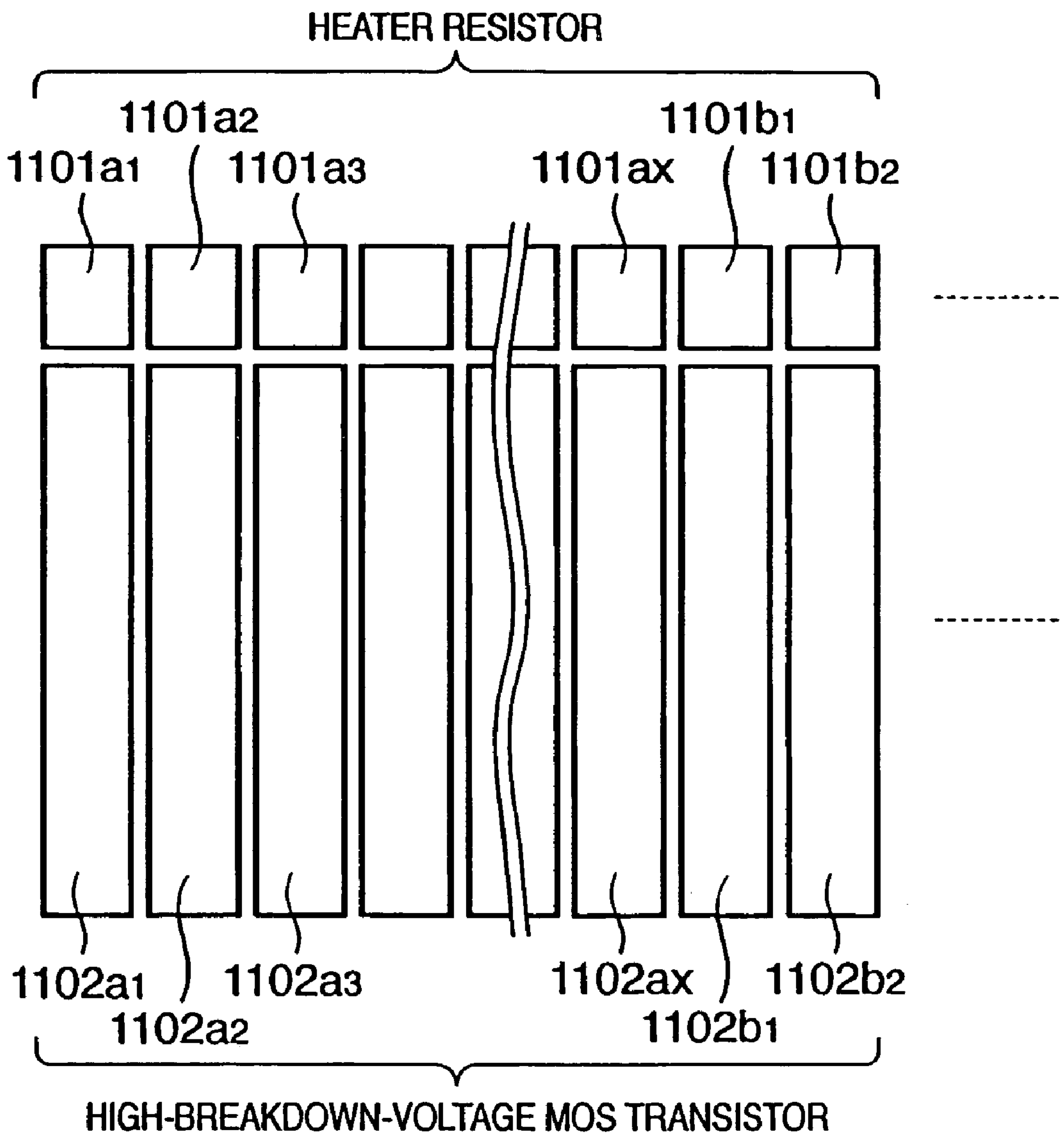
FIG. 13 PRIOR ART
FIG. 13 is a block diagram showing an example of the arrangement of a heater resistor and high-breakdown-voltage MOS transistor on the conventional heater board.
Figure 14:
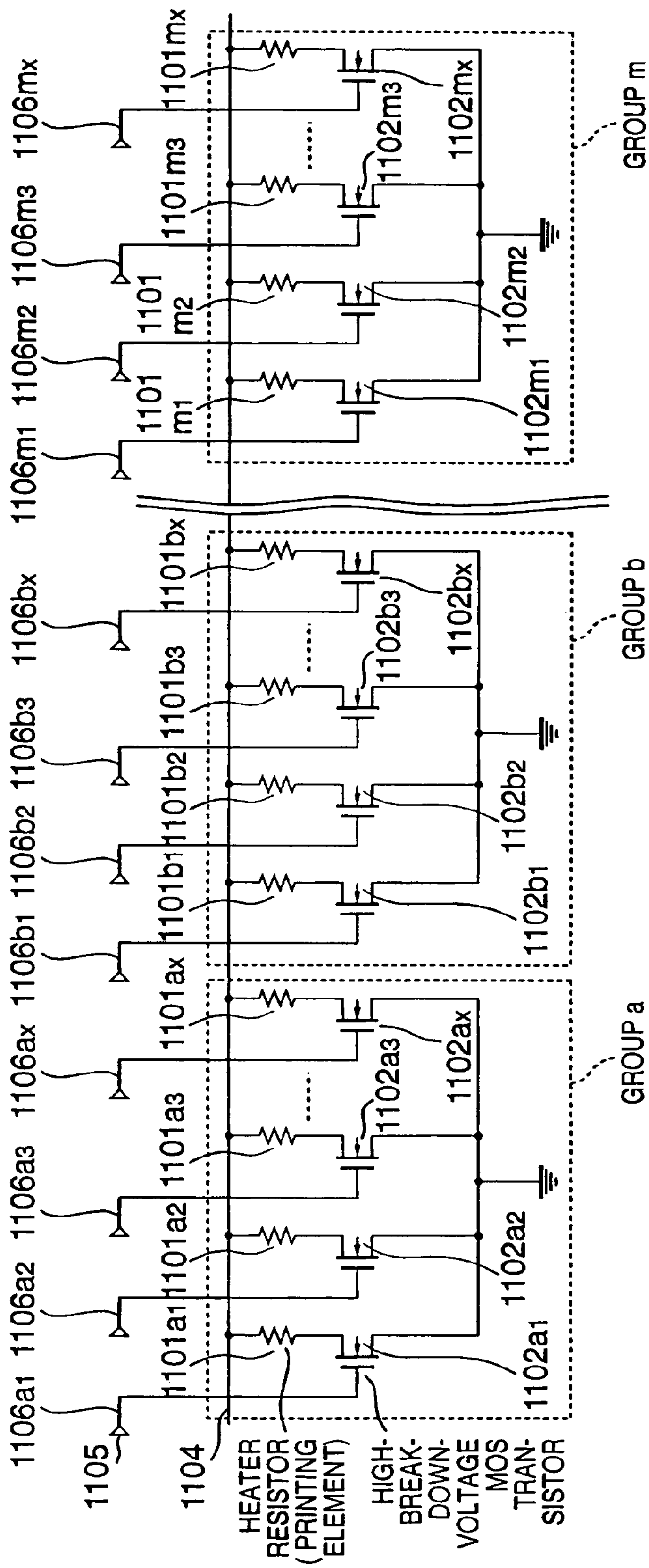
FIG. 14 PRIOR ART
FIG. 14 is a circuit diagram showing an example of the arrangement of a conventional driving circuit.
Figure 15:
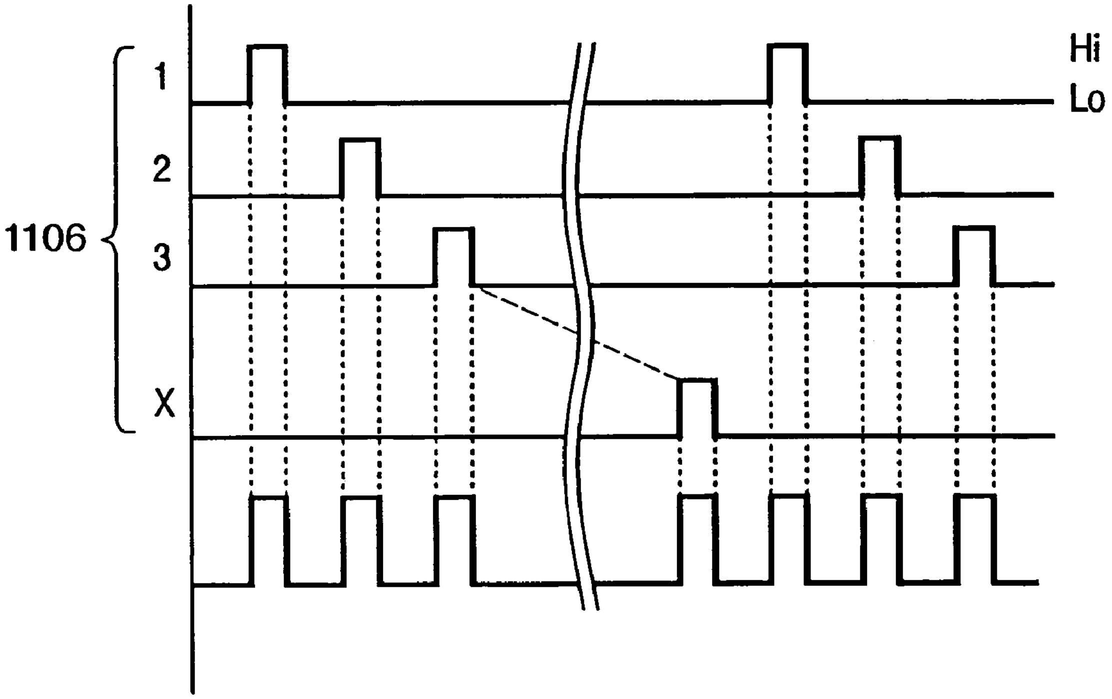
FIG. 15 PRIOR ART
FIG. 15 is a timing chart for driving the conventional driving circuit.
Figure 16A:
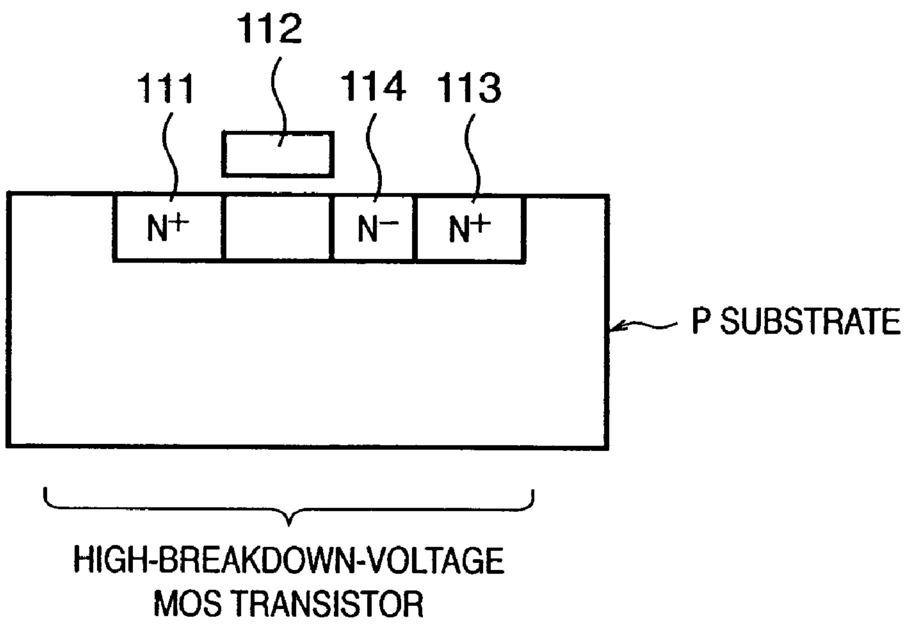
FIG. 16A is a sectional view showing the sectional structure of a high-breakdown-voltage MOS transistor.
Figure 16B:
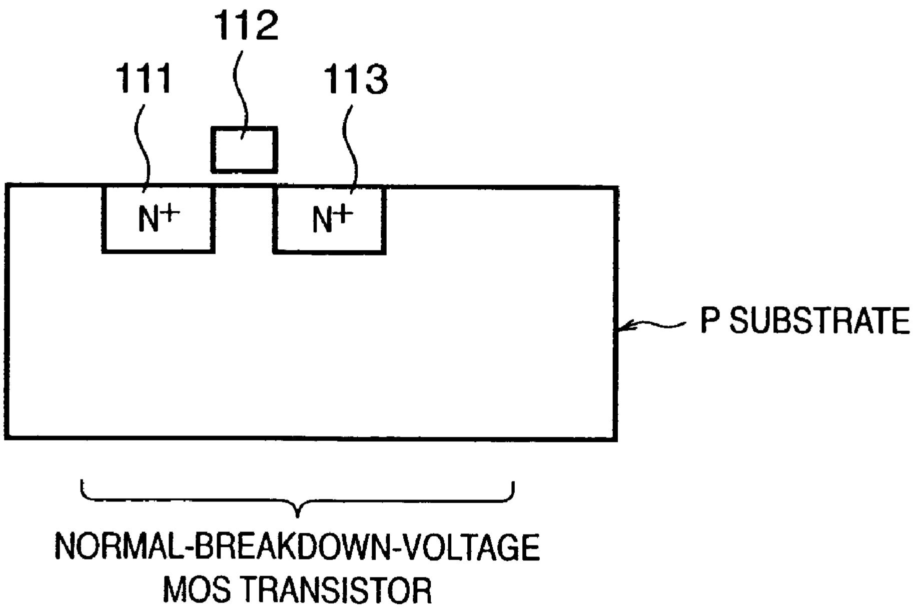
FIG. 16B is a sectional view showing the sectional structure of a normal-breakdown-voltage MOS transistor.

FIG. 11 is a perspective view showing the outer appearance of the ink cartridge IJC dividable into the ink tank and head.

As shown in FIG. 11, the ink cartridge IJC can be divided into the ink tank IT and printhead IJH at a boundary K (black). The ink cartridge IJC has an electrode (notshown) for receiving an electrical signal supplied from the carriage HC when the ink cartridge IJC is mounted on the carriage HC. The printhead IJH is driven by the electrical signal to discharge ink, as described above. In FIG. 11, reference numeral 500 denotes an ink orifice line. The ink tank IT has a fibrous or porous ink absorber in order to hold ink.

[Heater Driving Circuit of Printhead]

The printhead according to the first embodiment which is mounted in the above-described ink-jet printer will be explained.

Figure 1:
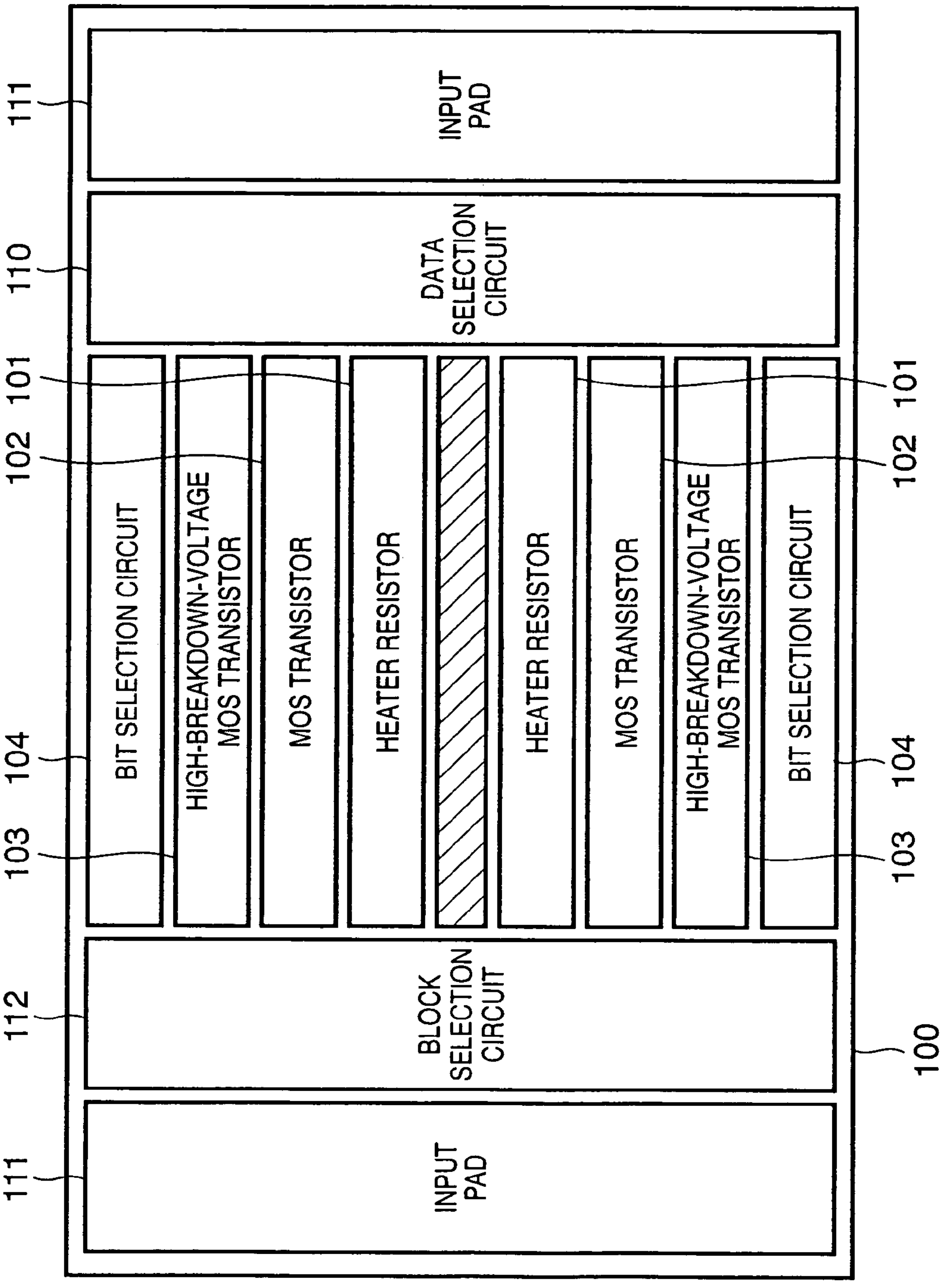
FIG. 1 is a block diagram showing an example of the arrangement of a heater board according to an embodiment of the present invention.

FIG. 1 shows the layout of elements (circuits) on a heater board 100 for the printhead of the first embodiment.

Figure 2:
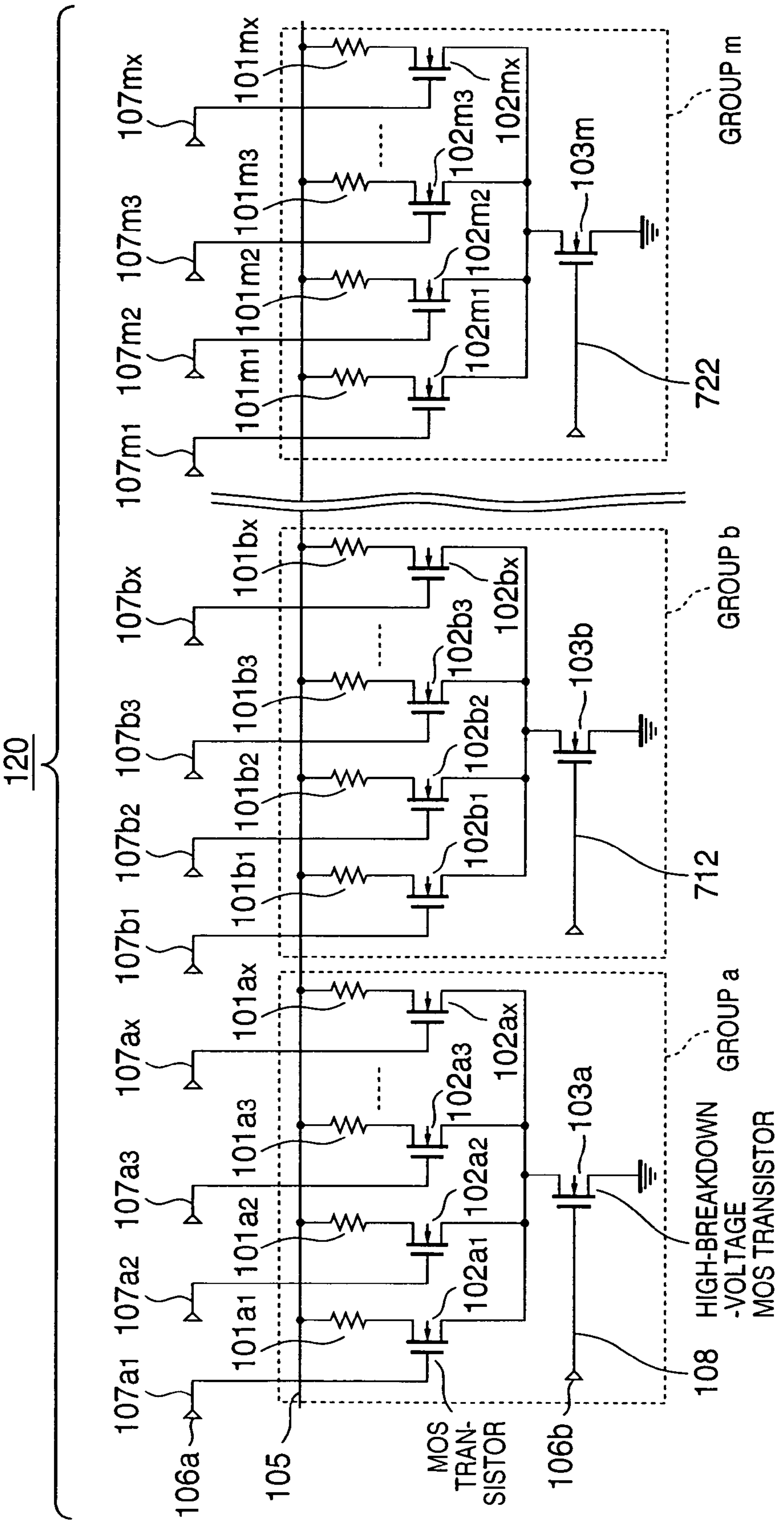
FIG. 2 is a circuit diagram showing an example of the arrangement of a driving circuit according to the first embodiment of the present invention.

The printhead heater board (element board) 100 comprises, on a single semiconductor substrate, heater resistors 101 serving as electrothermal transducers (printing elements), MOS transistors 102 which switch a predetermined current for the heater resistors 101, high-breakdown-voltage MOS transistors 103 which switch a current for respective groups surrounded by dotted lines in FIG. 2, bit selection circuits 104 which select desired printing pixels (bits), a data selection circuit 110, input pads 111, and a block selection circuit 112 which selects a heater in the group.

FIG. 2 shows a heater driving circuit 120 for discharging ink from the nozzle (orifice) of the printhead according to the first embodiment. The heater driving circuit-120 is divided into groups a to m.

In FIG. 2, reference numerals 101*a*1 to 101*mx* denote heater resistors (printing elements); 102*a*1 to 102*mx*, MOS transistors serving as individual switches which are arranged for the respective heater resistors and switch the heater resistors; 103*a* to 103*m*, high-breakdown-voltage MOS transistors which belong to groups a to m, serve as common switches arranged commonly to parallel-connected heater resistors, and have higher breakdown voltages than those of the MOS transistors 102*a*1 to 102*mx*; 105, a power supply line connected to a power supply (not shown); and 106*a* and 106*b*, control terminals connected to a controller (not shown).

In the first embodiment, the MOS transistor 102 (N type) having a lower ON resistance in driving the heater resistor than that of the high-breakdown-voltage MOS transistor is used as an individual switch arranged for each heater resistor, in order to decrease the ON resistance of the transistor in driving the heater resistor. The high-breakdown-voltage MOS transistor (N type) is used only as a common switch commonly arranged for heater resistors. Compared to the use of a high-breakdown-voltage MOS transistor as an individual switch, the heater board according to the first embodiment has a smaller number of high-breakdown-voltage MOS transistors used, and the ON resistance of the entire heater board in driving the heater resistor can be decreased. Since the heater resistor is connected to the power supply 105 and the transistor is arranged on the ground side, the ON resistance in driving the heater board is further decreased.

As shown in FIG. 2, the heater driving circuit 120 is divided into groups a to m. Groups a to m contain the same number of heater resistors 101 and the same number of MOS transistors 102 serving as heater resistor driving switches. Each of groups a to m contains one high-breakdown-voltage MOS transistor 103 serving as a driving switch for driving the heater resistor 101.

For example, in group a, the power supply line 105 is commonly connected to the heater resistors 101*a*1 to 101*ax*. The MOS transistors 102*a*1 to 102*ax* serving as the first driving switches of the heater resistors 101*a*1 to 101*ax* are series-connected between the power supply 105 and ground. One high-breakdown-voltage MOS transistor serving as the second driving switch of the heater resistors 101*a*1 to 101*ax* is parallel-connected as a common switch between the MOS transistors 102*a*1 to 102*ax* and ground. Although not described, the remaining groups b to m have the same arrangement as that of group a.

[Operation of Heater Driving Circuit]

The operation of the heater driving circuit 120 will be explained with reference to the waveform timing chart of FIG. 3.

Figure 3:
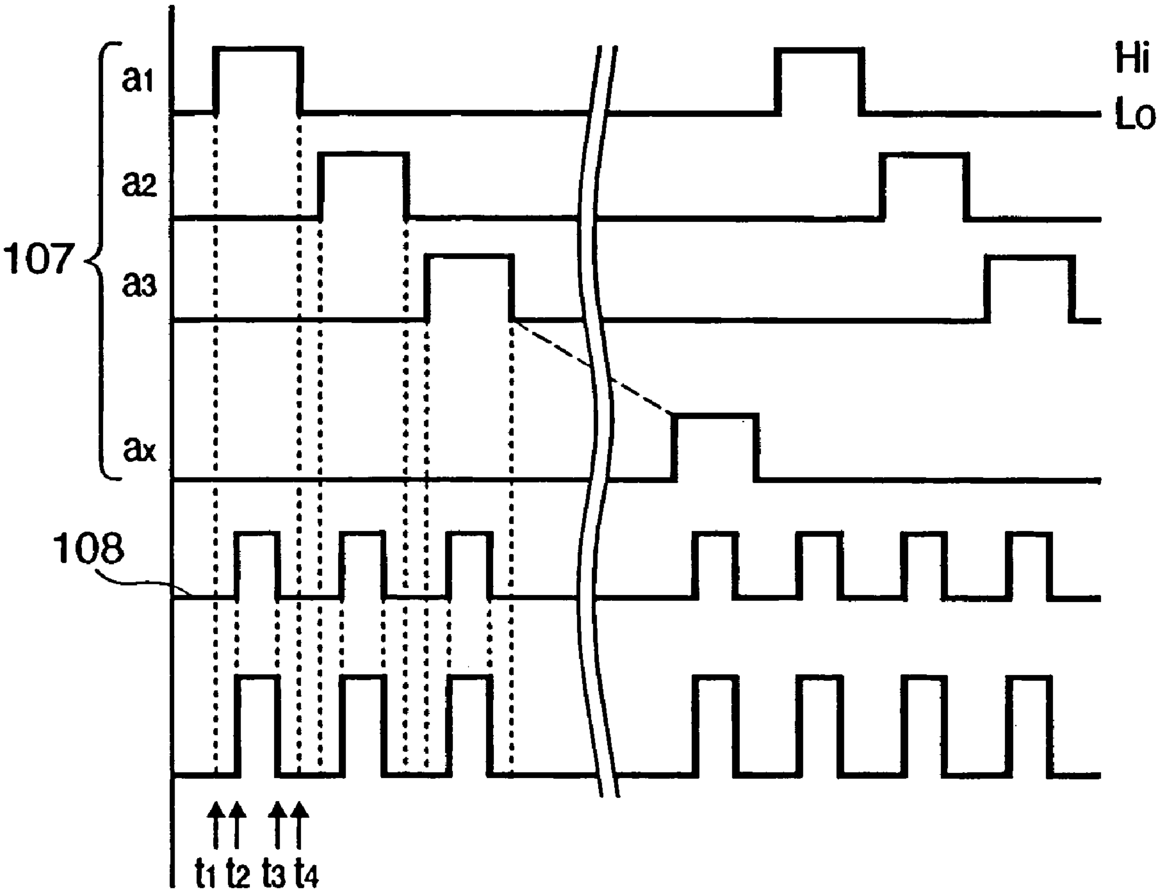
FIG. 3 is a timing chart for driving the driving circuit according to the first embodiment of the present invention.

FIG. 3 is a timing chart showing a driving signal for driving x heater resistors in respective groups when x heaters are classified into groups in units of m heaters.

Control signals 107_a_1 to 107_ax_ in FIG. 3 are input to the control terminals 106_a_1 to 106_ax_ to drive the MOS transistors 102_a_1 to 102_ax_. The transistor is turned on (connected) for Hi in the waveform and off (disconnected) for Lo. A control signal 108 is input to the control terminals 106_b_ in FIG. 2 to drive the high-breakdown-voltage MOS transistors 103_a_ to 103_m_. The transistor is turned on (connected) for Hi in the waveform and off (disconnected) for Lo.

The timing chart in FIG. 3 will be described by exemplifying group a in FIG. 2. The control signals 107_a_1 to 107_ax_ are driving timing signals for the MOS transistors 102_a_1 to 102_ax_ serving as the first driving switches of the first to xth heater resistors 101 belonging to group a. The control signal 108 is a driving timing signal for the high-breakdown-voltage MOS transistor 103_a_ serving as the second driving switch of the first to xth heater resistors 101.

Application of a current to the first heater resistor 101_a_1 and stop of application will be explained. At time t1 in FIG. 3, the control signal 107_a_1 changes to Hi, and the MOS transistor 102_a_1 (first switch) of the heater resistor 101_a_1 is turned on.

At time t1, the high-breakdown-voltage MOS transistor 103_a_ is OFF, and no current flows through the heater resistor 101_a_1.

At time t2, the control signal 108 changes to Hi, and the high-breakdown-voltage MOS transistor 103_a_ (second switch) is turned on. A current is supplied to the heater resistor 101_a_1 connected to the MOS transistor 102_a_1 selected by the control signal 107_a_1.

Upon reception of the current, the heater resistor 101_a_1 is heated at an interval between time t2 and time t3. Heated ink is discharged from a nozzle, printing a predetermined pixel (dot).

At time t3, the control signal 108 changes to Lo, the high-breakdown-voltage MOS transistor 103_a_ (second switch) is turned off, and application of a current to the heater resistor 101_a_1 stops.

At time t4, the control signal 107_a_1 changes to Lo, and the MOS transistor 102_a_1 is turned off.

Application of a current to the heater resistors 101_a_2 to 101_ax_, printing of predetermined pixels (dots) by discharging heated ink, and stop of applying a current to the heater resistors 101_a_2 to 101_ax_ are sequentially performed in accordance with the timing chart of FIG. 3.

By sequentially driving heaters in the respective groups by time division, the current in each group can always be controlled to a current of 1 bit (pixel printed by one nozzle) or less. No large current need be supplied to heater resistors at once.

In this control, the current flowing through the heater resistor 101_a_1 is controlled in accordance with the control signal 108, and the pulse width of the current flowing through the heater resistor 101_a_1 is controlled by the high-breakdown-voltage MOS transistor 103_a_.

The heater resistors 101_a_1 to 101_ax_ in group a are selected by selecting the MOS transistors 102_a_1 to 102_ax_. The pulse widths of the control signals 107_a_1 to 107_ax_ for the MOS transistors 102_a_1 to 102_ax_ are set large so as to contain corresponding parts of the control signal 108.

When the current flowing through the heater resistor changes from OFF to ON or from ON to OFF, a selected MOS transistor 102 is always ON (connected).

The MOS transistor 102 is not switched while the voltage between the source and the drain is high. Thus, a MOS transistor lower in breakdown voltage than the high-breakdown-voltage MOS transistor 103 can be adopted.

[Arrangement of Heater Board]

Figure 4:
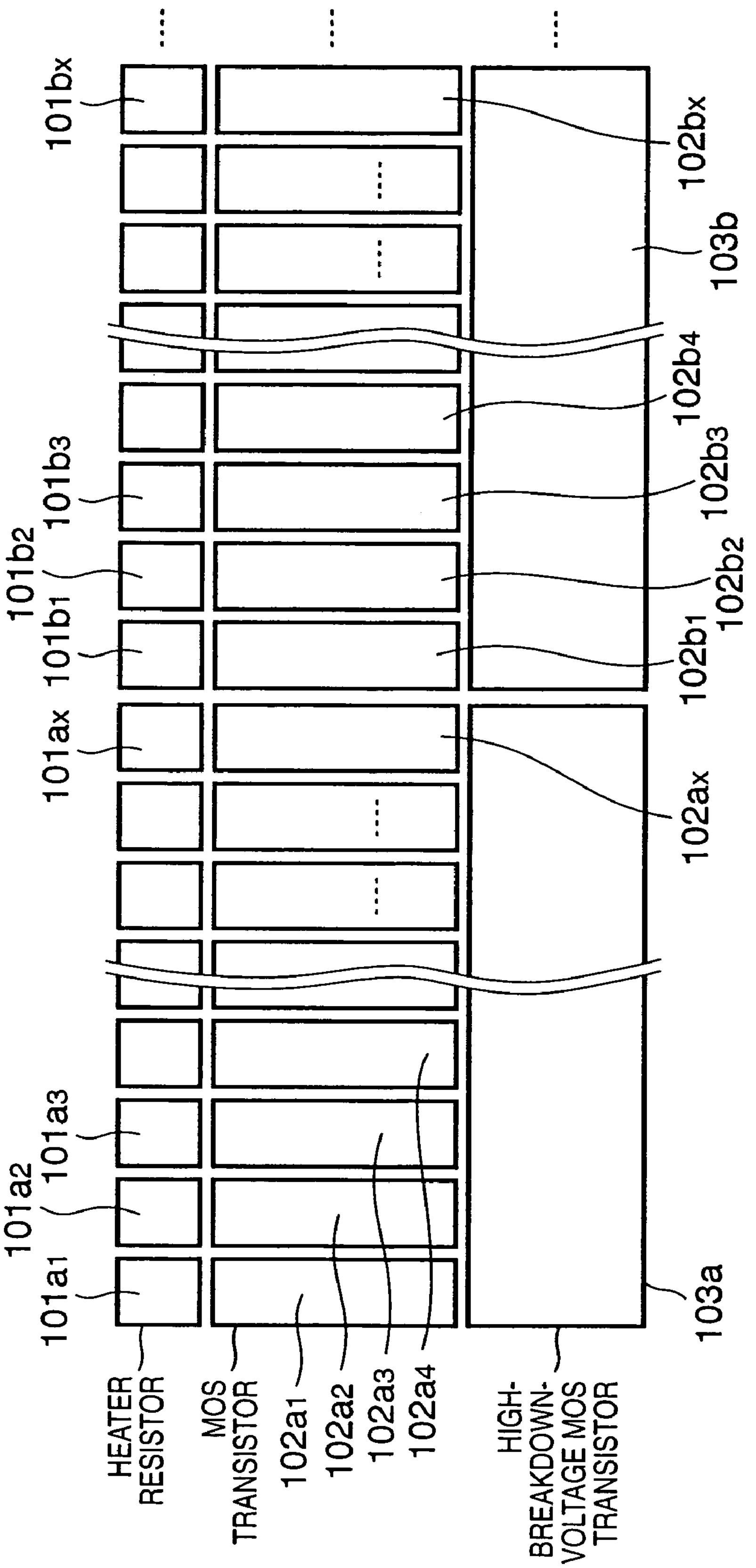
FIG. 4 is a block diagram showing an example of the arrangement of a heater resistor, MOS transistor, and high-breakdown-voltage MOS transistor on a heater board according to the first embodiment of the present invention.

FIG. 4 shows an example of the layout of the heater resistors, MOS transistors, and high-breakdown-voltage MOS transistors on the heater board 100 according to the first embodiment. The heater resistors 101_a_1 to 101_mx_ are series-connected to the corresponding MOS transistors 102_a_1 to 102_mx_.

The pitch of the heater resistors 101_a_1 to 101_mx_ and the pitch of the corresponding MOS transistors 102_a_1 to 102_mx_ are set equal to each other in order to shorten the connection line and effectively utilize the board area. Each of the high-breakdown-voltage MOS transistors 103_a_ to 103_m_ is arranged in a corresponding group, and designed to a length set by multiplying the number (x) of heater resistors in each group by the pitch of the heater resistors. The high-breakdown-voltage MOS transistors 103_a_ to 103_m_ are arranged at positions shown in FIG. 4 so as to be connected to the corresponding MOS transistors 102_a_1 to 102_ax_, 102_b_1 to 102_bx_, . . . in the respective groups.

The high-breakdown-voltage MOS transistors 103_a_ to 103_m_ have a higher ON resistance per unit area than that of the general MOS transistors 102_a_1 to 102_mx_. As shown in FIG. 4, the areas of the high-breakdown-voltage MOS transistors 103_a_ to 103_m_ are set larger than those of the general MOS transistors 102_a_1 to 102_mx_. This can satisfactorily decrease the ON resistances of the high-breakdown-voltage MOS transistors 103_a_ to 103_m_.

The normal-breakdown-voltage MOS transistors 102_a_1 to 102_mx_ which are lower in ON resistance value per unit area are employed as transistors which select heater resistors in each group. The sum of the ON resistances of the MOS transistors 102_a_1 to 102_mx_ series-connected to heater resistors and the high-breakdown-voltage MOS transistors 103_a_ to 103_m_ can be suppressed small.

The switching MOS transistors and high-breakdown-voltage MOS transistors for controlling a voltage applied to heater resistors are integrally formed together with the heater resistors in a common substrate by a semiconductor process. The line between MOS transistors and the line up to an orifice heater with voltage variations can be shortened, improving the response performance of the circuit.

[Operation of Heater Driving Circuit]

Figure 5:
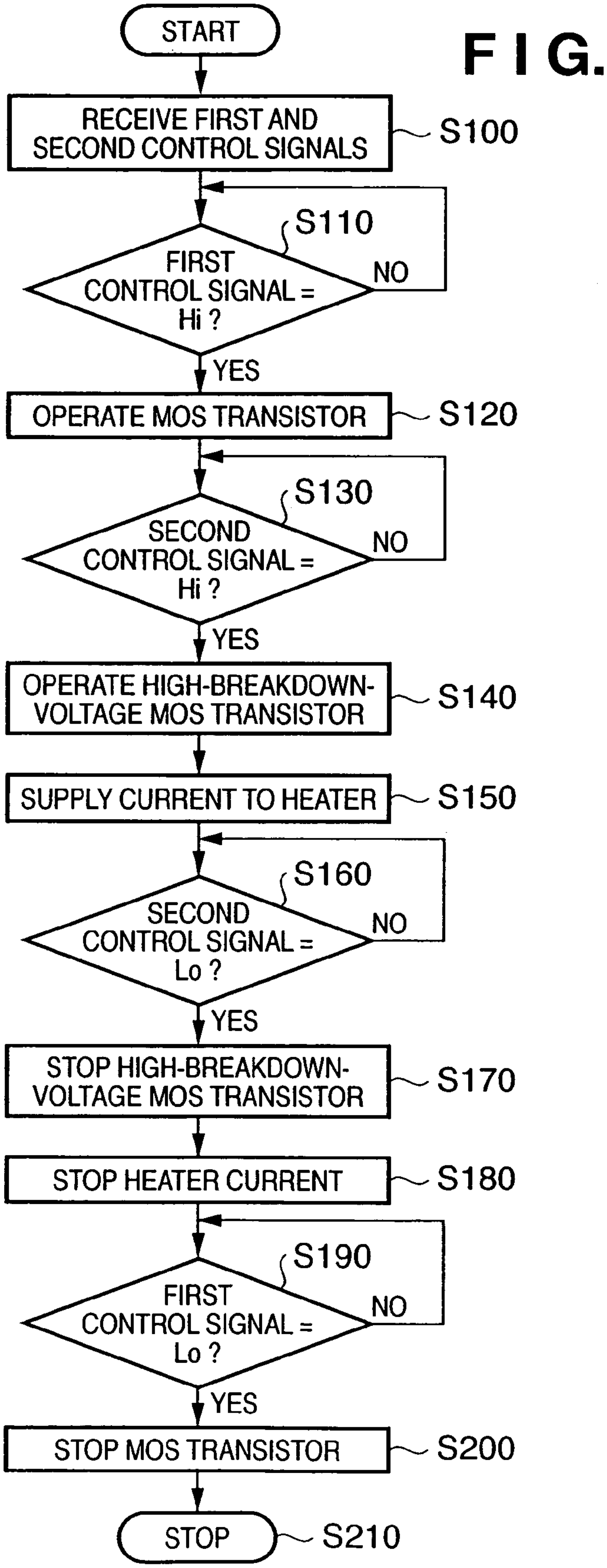
FIG. 5 is a flow chart for explaining a driving circuit control method according to the present invention.

The operation of the heater driving circuit 120 will be explained with reference to the flow chart of FIG. 5.

In step S100, the control signals 107_a_1 to 107_ax_ and control signal 108 in FIG. 3 are received. The control signals 107_a_1 to 107_ax_ are driving timing signals (first control signals) for the MOS transistors 102_a_1 to 102_ax_ serving as the first driving switches of the first to xth heater resistors 101_a_1 to 101_ax_ belonging to group a. The control signal 108 is a driving timing signal (second control signal) for the high-breakdown-voltage MOS transistor 103_a_ serving as the second driving switch of the first to xth heater resistors 101_a_1 to 101_ax_.

Instep S110, whether the first control signal is “Hi” is determined. If NO in step S110, the flow waits until the first control signal changes to “Hi”; if YES, advances to step S120.

In step S120, the control signal 107_a_1 changes to "Hi" at time t1 in FIG. 3, and the MOS transistor 102_a_1 (first switch) of the heater resistor 101_a_1 is turned on. At time t1, the high-breakdown-voltage MOS transistor 103_a_ is OFF, and no current flows through the heater resistor 101_a_1.

In step S130, whether the second control signal is "Hi" is determined. If NO in step S130, the flow waits until the second control signal changes to "Hi"; if YES, advances to step S140.

In step S140, the control signal 108 changes to "Hi" at time t2 in FIG. 3, and the high-breakdown-voltage MOS transistor 103_a_ (second switch) is turned on.

In step S150, a current is supplied to the heater resistor 101_a_1 connected to the MOS transistor 102_a_1 selected by the control signal 107_a_1. The current heats the heater resistor 101_a_1 at an interval between time t2 and time t3, and heated ink is discharged from the nozzle to print a predetermined pixel (dot).

The flow advances to step S160 to determine whether the second control signal is "Lo". If NO in step S160, the flow waits until the second control signal changes to "Lo"; if YES, advances to step S170.

In step S170, the control signal 108 changes to "Lo" at time t3 in FIG. 3, and the high-breakdown-voltage MOS transistor 103_a_ (second switch) is turned off.

In step S180, current supply to the heater resistor 101_a_1 stops.

The flow advances to step S190 to determine whether the first control signal is "Lo". If NO in step S190, the flow waits until the first control signal changes to "Lo"; if YES, advances to step S200.

In step S200, the control signal 107_a_1 changes to "Lo" at time t4 in FIG. 3, and the MOS transistor 102_a_1 is turned off. The flow advances to step S210 to end a series of processes.

Second Embodiment

An ink-jet printhead according to the second embodiment and an ink-jet printer having the printhead will be described.

The ink-jet printer having the ink-jet printhead according to the second embodiment can take the same arrangement as that of the ink-jet printer described in the first embodiment. A repetitive description of the ink-jet printer and its control method will be omitted.

[Heater Driving Circuit of Printhead]

The printhead according to the second embodiment which is mounted in the ink-jet printer will be explained.

Figure 6:
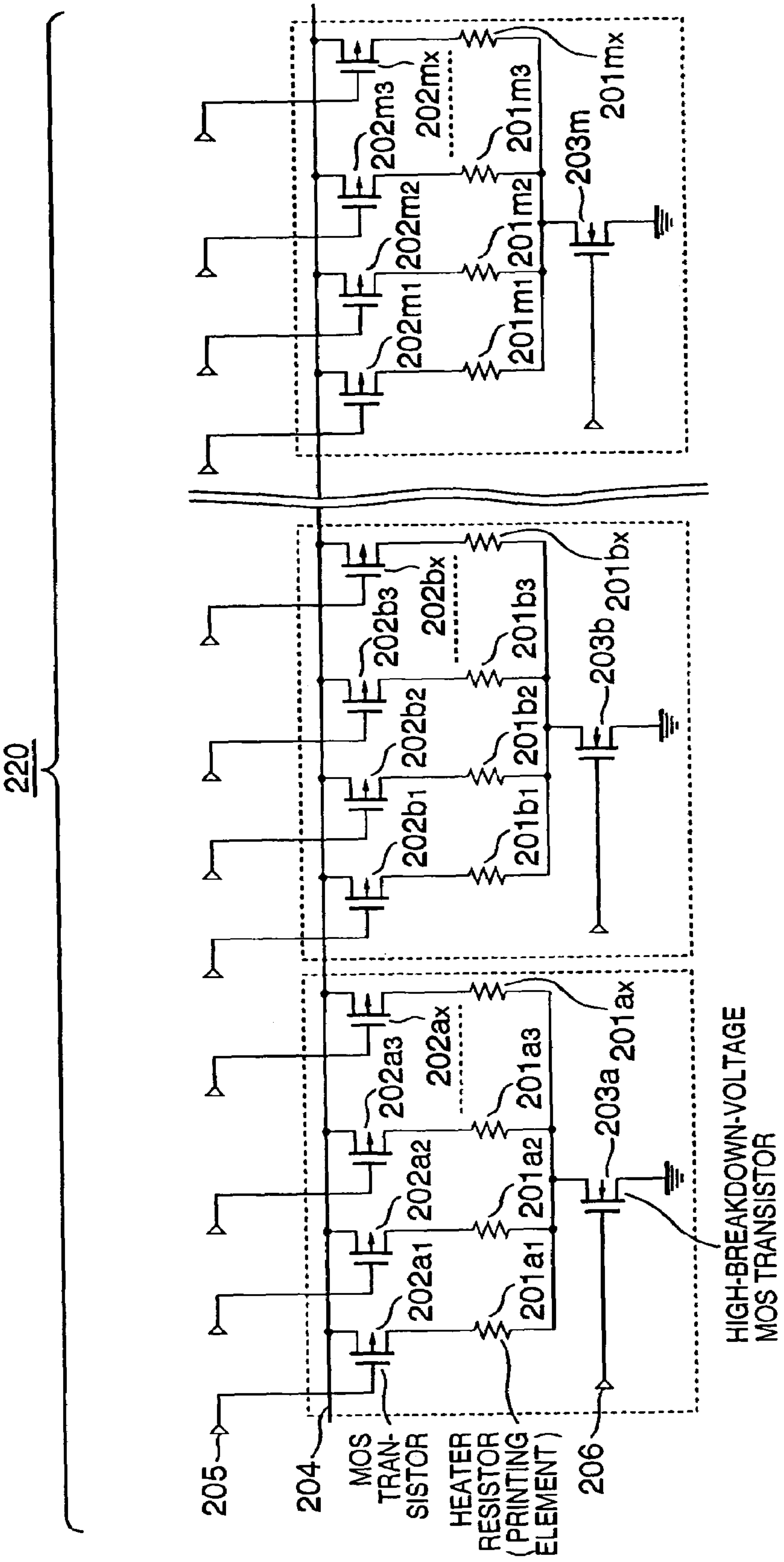
FIG. 6 is a circuit diagram showing an example of the arrangement of a heater resistor, MOS transistor, and high-breakdown-voltage MOS transistor on a heater board according to the second embodiment of the present invention.

FIG. 6 shows a heater driving circuit 220 for discharging ink from the nozzle of the printhead according to the second embodiment.

In FIG. 6, reference numerals 201_a_1 to 201_mx_ denote heater-resistors; 202_a_1 to 202_mx_, MOS transistors; 203_a_ to 203_m_, high-breakdown-voltage MOS transistors; 204, a power supply line connected to a power supply (not shown); and 205 and 206, control terminals connected to a controller (not shown).

As shown in FIG. 6, the heater driving circuit 220 is divided into groups a to m. Groups a to m contain the same number of heater resistors 201 and the same number of MOS transistors 202 serving as heater resistor driving switches. Groups a to m contain the corresponding high-breakdown-voltage MOS transistors 203_a_ to 203_m_ serving as driving switches for driving the heater resistors 201 in the respective groups.

The second embodiment is different from the first embodiment in that the switching MOS transistor which selects and drives a heater resistor in a group is a P-type MOS transistor higher in breakdown voltage than an N-type MOS transistor, instead of an N-type MOS transistor used in the first embodiment.

This arrangement can increase the breakdown voltage of the switching MOS transistor for a printhead in which switching MOS transistors are arranged at a high density.

Third Embodiment

An ink-jet print head according to the third embodiment and an ink-jet printer having the printhead will be described.

The ink-jet printer having the ink-jet printhead according to the third embodiment can take the same arrangement as that of the ink-jet printer described in the first embodiment. A repetitive description of the ink-jet printer and its control method will be omitted.

[Heater Driving Circuit of Printhead]

The printhead according to the third embodiment which is mounted in the ink-jet printer will be explained.

Figure 7:
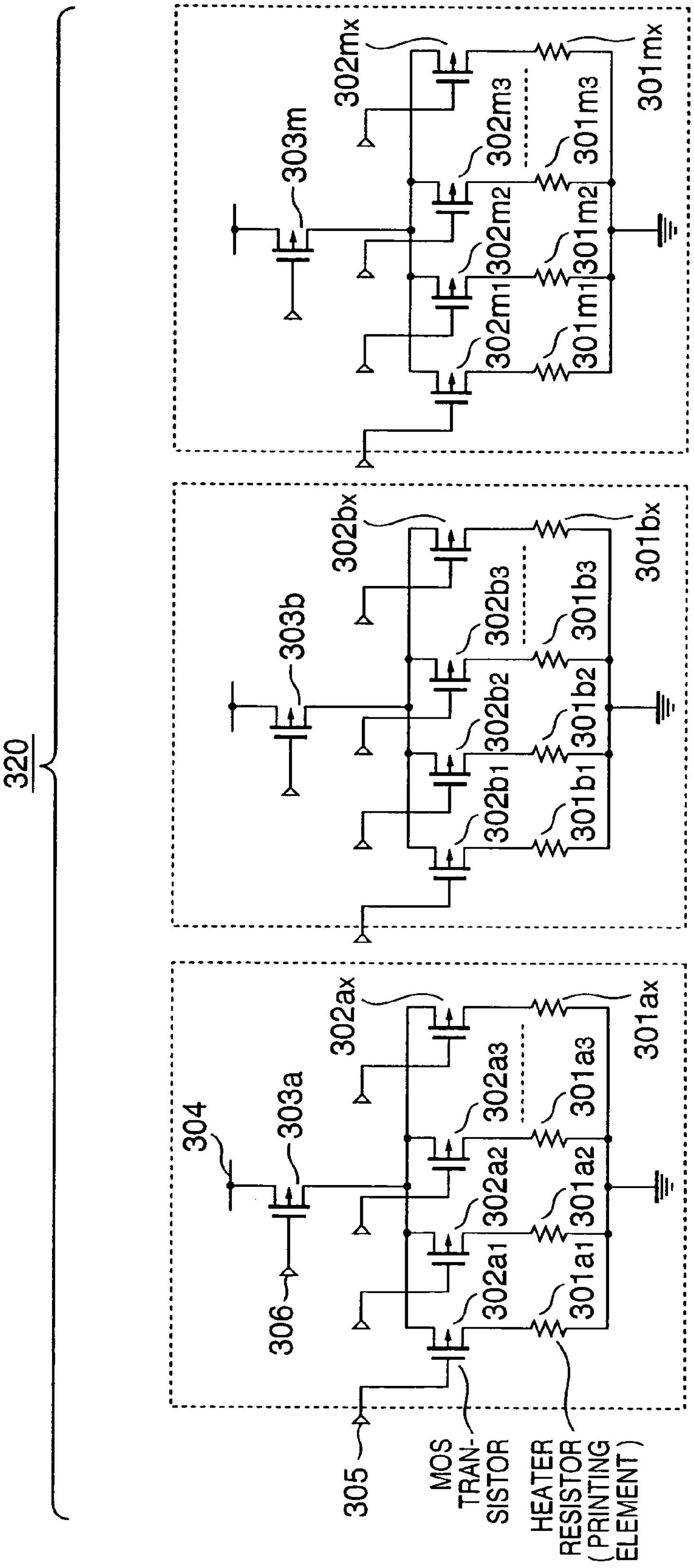
FIG. 7 is a circuit diagram showing an example of the arrangement of a heater resistor, MOS transistor, and high-breakdown-voltage MOS transistor on a heater board according to the third embodiment of the present invention.

FIG. 7 shows a heater driving circuit 320 for discharging ink from the nozzle of the printhead according to the third embodiment.

In FIG. 7, reference numerals 301_a_1 to 301_mx_ denote heater resistors; 302_a_1 to 302_mx_, MOS transistors; 303_a_ to 303_m_, high-breakdown-voltage MOS transistors; 304, a power supply line connected to a power supply (not shown); and 305 and 306, control terminals connected to a controller (not shown).

As shown in FIG. 7, the heater driving circuit 320 is divided into groups a to m. Groups a to m contain the same number of heater resistors 301 and the same number of MOS transistors 302 serving as heater resistor driving switches. Groups a to m contain the corresponding high-breakdown-voltage MOS transistors 303_a_ to 303_m_ serving as driving switches for driving the heater resistors 301 in the respective groups.

The third embodiment is different from the first embodiment in that the MOS transistor (individual switch) which selects and drives a heater resistor in a group is a P-type MOS transistor higher in breakdown voltage than an N-type MOS transistor, instead of an N-type MOS transistor used in the first embodiment, and the MOS transistor which selects and drives a group is a P-type high-break down-voltage MOS transistor higher in breakdown voltage than an N-type MOS transistor, instead of an N-type high-breakdown-voltage MOS transistor (common switch) used in the first embodiment

Fourth Embodiment

An ink-jet printhead according to the fourth embodiment and an ink-jet printer having the printhead will be described.

The ink-jet printer having the ink-jet printhead according to the fourth embodiment can take the same arrangement as that of the ink-jet printer described in the first embodiment. A repetitive description of the ink-jet printer and its control method will be omitted.

[Heater Driving Circuit of Printhead]

The printhead according to the fourth embodiment which is mounted in the ink-jet printer will be explained.

Figure 8:
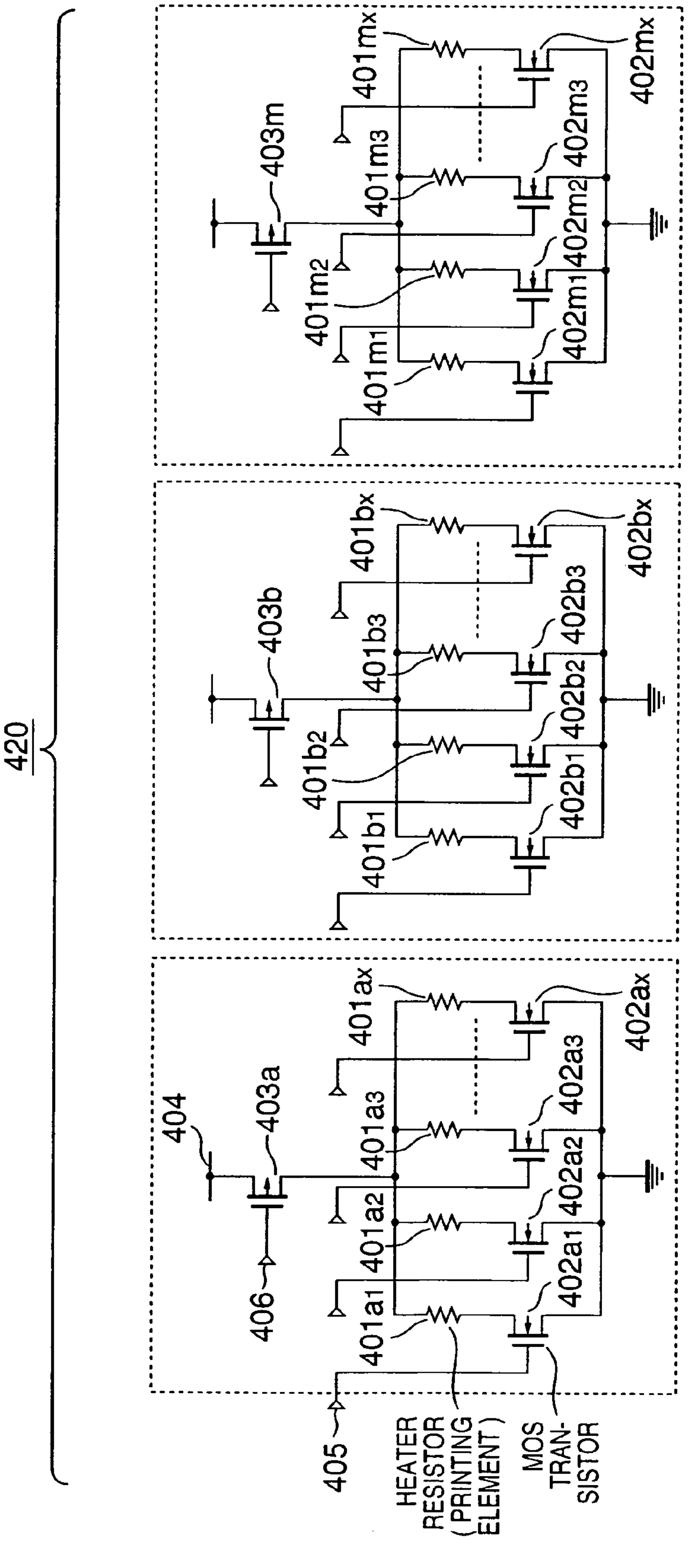
FIG. 8 is a circuit diagram showing an example of the arrangement of a heater resistor, MOS transistor, and high-breakdown-voltage MOS transistor on a heater board according to the fourth embodiment of the present invention.

FIG. 8 shows a heater driving circuit 420 for discharging ink from the nozzle of the printhead according to the fourth embodiment.

In FIG. 8, reference numerals 401_a_1 to 401_mx_ denote heater resistors; 402_a_1 to 402_mx_, MOS transistors; 403_a_ to

403*m*, high-breakdown-voltage MOS transistors; 404, a power supply line connected to a power supply (not shown); and 405 and 406, control terminals connected to a controller (not shown).

As shown in FIG. 8, the heater driving circuit 420 is divided into groups a to m. Groups a to m contain the same number of heater resistors 401 and the same number of MOS transistors 402 serving as heater resistor driving switches. Groups a to m contain the corresponding high-breakdown-voltage MOS transistors 403*a* to 403*m* serving as driving switches for driving the heater resistors 401 in the respective groups.

The fourth embodiment is different from the third embodiment in the layout of heater resistors in each group and the MOS transistor (individual switch) which selects and drives a heater resistor, and the use of an N-type MOS transistor as the MOS transistor. In the above embodiments, droplets discharged from the printhead are ink, and a liquid contained in the ink tank is ink. The content of the ink tank is not limited to ink. For example, the ink tank may contain a processing solution to be discharged onto a printing medium in order to increase the fixing properties, water resistance, or quality of a printed image.

Of ink-jet printing systems, the embodiments can adopt a system which comprises a means (e.g., an electrothermal transducer) for generating heat energy as energy utilized to discharge ink and changes the ink state by heat energy. This ink-jet printing system can increase the printing density and resolution.

As a representative arrangement or principle, the present invention preferably adopts the basic principle disclosed in, e.g., U.S. Pat. Nos. 4,723,129 or 4,740,796. This system is applicable to both a so-called on-demand apparatus and continuous apparatus. The system is particularly effective for the on-demand apparatus because of the following reason. At least one driving signal which corresponds to printing information and gives a rapid temperature rise exceeding nuclear boiling is applied to an electrothermal transducer which is arranged in correspondence with a sheet or liquid channel holding a liquid (ink). This signal causes the electrothermal transducer to generate heat, and causes film boiling on the heat effecting surface of the printhead. Consequently, a bubble can be formed in the liquid (ink) in one-to-one correspondence with the driving signal.

Growth and shrinkage of the bubble discharge the liquid (ink) from an orifice, forming at least one droplet. The driving signal more preferably has a pulse shape because a bubble grows and shrinks instantaneously appropriately. This achieves discharge of the liquid (ink) with high response.

The pulse-like driving signal is preferably a signal disclosed in U.S. Pat. Nos. 4,463,359 or 4,345,262. Conditions disclosed in U.S. Pat. No. 4,313,124 which is an invention concerning the temperature rise ratio of the heat effecting surface can provide higher-quality printing.

The printhead structure can be a combination (linear liquid channel or right-angle liquid channel) of orifices and electrothermal transducers (orifice heaters) which are arranged in correspondence with liquid channels. The present invention also includes structures disclosed in U.S. Pat. Nos. 4,558,333 and 4,459,600 in which the heat effecting surface of an orifice heater is arranged in a bent region.

A full line type printhead having a length corresponding to the width of the largest printing medium printable by the printing apparatus can take a structure which meets this length by a combination of printheads as disclosed in the above-mentioned specifications, or a single integrated printhead structure.

It is also possible to employ a cartridge type printhead described in the embodiments in which an ink tank is integrated with a printhead itself, or an interchangeable chip type printhead which can be electrically connected to an apparatus main body and receive ink from the apparatus main body when attached to the apparatus main body.

The printing mode of the printing apparatus is not limited to a printing mode using only a main color such as black. The apparatus can adopt at least either a composite color mode using different colors or a full color mode using a color mixture regardless of whether the printhead is an integral printhead or a combination of printheads.

As described above, according to the embodiments, heater resistors are series-connected to normal MOS transistors in each group on a heater board. The pitch of the heater resistors and the pitch of the normal MOS transistors are designed equal to each other in order to shorten the connection line. One high-breakdown-voltage MOS transistor is arranged in each group, and the pitch is designed to a length corresponding to the product of the pitch of the heater resistors and the number x of heater resistors. The high-breakdown-voltage MOS transistor has a higher ON resistance value per unit area than that of the normal MOS transistor. However, the area of the high-breakdown-voltage MOS transistor is larger by x times than that of the normal MOS transistor. This can suppress the ON resistance of the high-breakdown-voltage MOS transistor satisfactorily low.

Driving elements (high-breakdown-voltage MOS transistors) which classify heater resistors into a plurality of groups, and select and drive each group, and driving elements (normal MOS transistors) which select and drive heaters in each group are formed on a single semiconductor substrate. The ON resistance of the driving element which drives a heater resistor can be decreased.

The area of the heater driving circuit can be reduced without changing the semiconductor manufacturing process.

As has been described above, the present invention can provide a printhead capable of decreasing the ON resistance value without increasing the heater board size in order to downsize the heater board, an image printing apparatus using the printhead, and a control method therefor.

As many apparently widely different embodiments of the present invention can be made without departing from the spirit and scope thereof, it is to be understood that the invention is not limited to the specific embodiments thereof except as defined in the claims.

What is claimed is:

1. An image printing apparatus which prints an image in accordance with input printing data by a printhead having a plurality of printing elements comprising:

a plurality of individual switches which are arranged for the respective printing elements;

a common switch which is arranged commonly to printing elements belonging to each of a plurality of groups of the printing elements; and driving means for controlling said plurality of individual switches and said common switch and driving the printing elements in accordance with the input printing data, wherein each of said individual switches is formed by a MOS transistor, and said common switch is formed by a high-breakdown-voltage MOS transistor having a higher breakdown voltage than a breakdown voltage of the MOS transistor for each of said individual switches, and said driving means controls said individual switches and said common switch so as to turn on said common switch after controlling said individual switches corresponding to image data to be printed in the case that the printing elements are driven.

2. The apparatus according to claim 1, wherein the printing elements, said plurality of individual switches, and said common switch are arranged on a single semiconductor substrate.

3. The apparatus according to claim 1, wherein the MOS transistor for each of said individual switches and the high-breakdown-voltage MOS transistor for said common switch are series-connected.

4. The apparatus according to claim 1, wherein the MOS transistor for each of said individual switches and the high-breakdown-voltage MOS transistor for said common switch are formed from NMOS transistors.

5. The apparatus according to claim 1, wherein the printing element, the MOS transistor for each of said individual switches, and the high-breakdown-voltage MOS transistor for said common switch are sequentially arranged into a circuit from a power supply line side to ground.

6. The apparatus according to claim 1, wherein the MOS transistor for each of said individual switches includes a PMOS transistor, wherein the high-breakdown-voltage MOS transistor for said common switch includes an NMOS transistor, and wherein the MOS transistor for each of said individual switches, the printing element, and the high-breakdown-voltage MOS transistor for said common switch are sequentially arranged into a circuit from a power supply line side to ground.

7. The apparatus according to claim 1, wherein the printhead includes a printhead which discharges ink by using heat energy, and the image printing apparatus further comprises a thermal transducer for generating the heat energy to be applied to the ink.

8. A printhead which has a plurality of printing elements and is used in an image printing apparatus for printing an image in accordance with input printing data comprising:

a plurality of individual switches which are arranged for the respective printing elements;

a common switch which is arranged commonly to printing elements belonging to each of a plurality of groups of the printing elements; and signal reception means for, when receiving an individual switch operating signal for operating said plurality of individual switches or a common switch operating signal for operating said common switch, inputting the received signal to said individual switch or said common switch, wherein each of said individual switches is formed by a MOS transistor, and said common switch is formed by a high-breakdown-voltage MOS transistor having a higher breakdown voltage than a breakdown voltage of the MOS transistor for each of said individual switches, and said common switch is controlled so as to be turned on after controlling said individual switches corresponding to image data to be printed in the case that the printing elements are driven.

9. The printhead according to claim 8, wherein the printing elements, said plurality of individual switches, and said common switch are arranged on a single semiconductor substrate.

10. The printhead according to claim 8, wherein the MOS transistor for each of said individual switches and the high-breakdown-voltage MOS transistor are formed from NMOS transistors.

11. The printhead according to claim 8, wherein the printing element, the MOS transistor for each of said individual switches, and the high-breakdown-voltage MOS transistor for said common switch are sequentially arranged into a circuit from a power supply line side to ground.

12. The printhead according to claim 8, wherein the MOS transistor for each of said individual switches includes a PMOS transistor, wherein the high-breakdown-voltage MOS transistor includes an NMOS transistor, and wherein the MOS transistor for each of said individual switches, the printing element, and the high-breakdown-voltage MOS transistor for said common switch are sequentially arranged into a circuit from a power supply line side to ground.

13. The printhead according to claim 8, wherein the printhead includes a printhead which discharges ink by using heat energy, and further comprises a thermal transducer for generating the heat energy to be applied to the ink.

14. A method for controlling a printhead which has a plurality of printing elements and is used in an image printing apparatus for printing an image in accordance with input printing data, wherein the printhead comprises a plurality of individual switches which are arranged for the respective printing elements; a common switch which is arranged commonly to printing elements belonging to each of a plurality of groups of the printing elements; and signal reception means for, when receiving an individual switch operating signal for operating said plurality of individual switches or a common switch operating signal for operating said common switch, inputting the received signal to said individual switch or said common switch, wherein each of said individual switches is formed by a MOS transistor, and said common switch is formed by a high-breakdown-voltage MOS transistor having a higher breakdown voltage than a breakdown voltage of the MOS transistor for each of said individual switches, said method, in the case that the printing elements are driven, comprising the steps of:

controlling said individual switches corresponding to image data to be printed; and turning on said common switch after said individual switches are controlled.

* * * * *